(12) United States Patent
Huang et al.

(10) Patent No.: US 9,077,324 B2
(45) Date of Patent: Jul. 7, 2015

(54) CLAMP CIRCUIT AND METHOD FOR CLAMPING VOLTAGE

(71) Applicant: Fairchild Semiconductor Corporation, San Jose, CA (US)

(72) Inventors: Lei Huang, Beijing (CN); Eric Li, Beijing (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 51 days.

(21) Appl. No.: 13/841,820

(22) Filed: Mar. 15, 2013

(65) Prior Publication Data
US 2013/0285730 A1 Oct. 31, 2013

(30) Foreign Application Priority Data

Mar. 15, 2012 (CN) .......................... 2012 1 0069342

(51) Int. Cl.
*H03K 5/08* (2006.01)
(52) U.S. Cl.
CPC ....................................... *H03K 5/08* (2013.01)
(58) Field of Classification Search
CPC ....................................................... H03K 5/08
USPC ........... 327/52, 53, 63, 65, 66, 307, 309, 313, 327/321
See application file for complete search history.

(56) References Cited

U.S. PATENT DOCUMENTS

| 5,589,785 | A | * | 12/1996 | Garavan | 327/63 |
| 5,600,275 | A | * | 2/1997 | Garavan | 327/307 |
| 5,973,561 | A | * | 10/1999 | Heaton | 330/252 |
| 7,233,174 | B2 | * | 6/2007 | Martins | 327/65 |
| 8,742,819 | B2 | * | 6/2014 | Merkin et al. | 327/309 |

* cited by examiner

*Primary Examiner* — Patrick O'Neill
(74) *Attorney, Agent, or Firm* — Schwegman Lundberg & Woessner, P.A.

(57) ABSTRACT

The disclosure provides a clamp circuit and a method for clamping voltage. The clamp circuit includes: a first switch control unit, connected with the high-potential terminal of the first stage output of a comparator and configured to clamp the voltage of the high-potential terminal to $V_{Gate1}$ when the voltage of the high-potential terminal is lower than a first pre-set value $V_1$, and a second switch control unit, connected to the low-potential terminal of the first stage output of the comparator and configured to clamp the voltage of the low-potential terminal to $V_{Gate2}$ when the voltage of the low-potential terminal is higher than a second pre-set value $V_2$, wherein the voltages of the first stage output of the comparator are between $V_{GND}$ and $V_{CC}$. By the disclosure, the output voltage swings of the first stage of the comparator are limited, and thereby the processing speed of the comparator is improved.

19 Claims, 6 Drawing Sheets

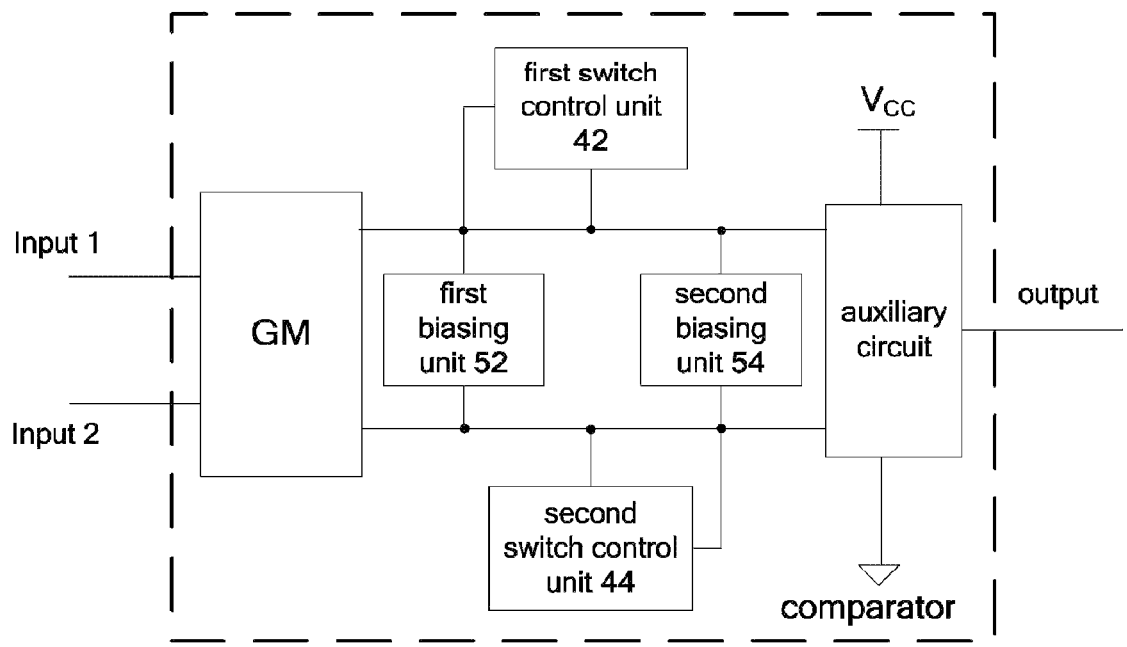

FIG. 5 configure a first switch control unit connected with the high-potential terminal of the first stage output of a comparator, wherein the first switch control unit is configured to clamp the voltage of the high-potential terminal to $V_{Gate1}$ when the voltage of the high-potential terminal is lower than a first preset value $V_1$ — S602 configure a second switch control unit connected with the low-potential terminal of the first stage output of the comparator, wherein the second switch control unit is configured to clamp the voltage of the low-potential terminal at $V_{Gate2}$ when the voltage of the low-potential terminal is higher than a second preset value $V_2$ — S604

FIG. 6

CLAMP CIRCUIT AND METHOD FOR CLAMPING VOLTAGE

CLAIM OF PRIORITY

This application claims the benefit of priority under 35 U.S.C. §119 to Chinese Patent Application Serial No. 201210069342.X, filed on Mar. 15, 2012, which is incorporated herein by reference in its entirety.

TECHNICAL FIELD

The disclosure relates to the field of electronic circuit, and in particular to a clamp circuit and a method for clamping voltage.

BACKGROUND

High-speed and low-power consumption has become the mainstream in modern communication technology. In many electronic equipment applications, the speed and precision of an Analogue-Digital Converter (ADC) is a key, potentially-limiting performance factor. Further, the performance of a voltage comparator in the ADC has a decisive impact on the overall conversion speed and precision of the ADC. Therefore, the design of the comparator is a key component of the design of the ADC.

In the conventional art, the tail current of the first stage output of a comparator is fixed. Thus, the voltage conversion rate of the first stage output can be limited, wherein the conversion rate indicates the time needed for generating conversion for the output state of the comparator and is generally required to be short as far as possible so as to implement high-speed comparison.

FIG. 1 shows an internal circuit schematic diagram of a comparator according to the conventional art. As shown in FIG. 1, node $P_{Gate}$ is a high-potential node of the first stage (namely, transconductance circuit, marked as "GM" in FIG. 1) output of the comparator, and node $N_{Gate}$ is the low-potential node of the first stage output of the comparator. FIG. 2 shows a schematic diagram of the output voltage waveform for the node $P_{Gate}$ of the first stage output of the comparator according to the conventional art. FIG. 3 shows a schematic diagram of the output voltage waveform for the node $N_{Gate}$ of the first stage output of the comparator according to the conventional art. As shown in FIG. 2 and FIG. 3, the node voltage swing of the first stage output of the comparator is always between $V_{GND}$ and $V_{CC}$, namely, the voltages are in full-swing output.

However, because the swing of the first stage output voltage of the comparator is often directly proportional to the delay time of the comparator, in the conventional art, the full-swing output voltage of the first stage of the comparator can cause a relatively longer delay time of the comparator and thus cause a low voltage conversion rate.

OVERVIEW

The present inventors have recognized, among other things, a scheme for clamping voltage to, for example, at least solve the above problem of low voltage conversion rate caused by long delay of the comparator in the conventional art. To achieve the scheme for clamping, a clamp circuit is provided.

In an example, the clamp circuit can include a first switch control unit, connected with a high-potential terminal of a first stage output of a comparator and configured to clamp the voltage of the high-potential terminal to $V_{Gate1}$ when the voltage of the high-potential terminal is lower than a first pre-set value V1, and a second switch control unit, connected to a low-potential terminal of the first stage output of the comparator and configured to clamp the voltage of the low-potential terminal to VGate2 when the voltage of the low-potential terminal is higher than a second pre-set value V2, wherein the voltage of the first stage output of the comparator is between $V_{GND}$ and $V_{CC}$.

In an example, the first switch control unit can include a first Metal Oxide Semiconductor Field Effect Transistor (MOSFET) and the second switch control unit can include a second MOSFET too. In an example, the first MOSFET is turned off when the voltage of the high-potential terminal is higher than or equal to $V_1$ and is turned on when the voltage of the high-potential terminal is lower than $V_1$, so as to clamp the voltage of the high-potential terminal, and the second MOSFET is turned off when the voltage of the low-potential terminal is lower than or equal to $V_2$ and is turned on when the voltage of the low-potential terminal is higher than $V_2$, so as to clamp the voltage of the low-potential terminal.

The clamp circuit can include a first biasing unit, connected with the first switch control unit and between the high-potential terminal and the low-potential terminal and configured to clamp the voltage of the high-potential terminal in the condition that the voltage of the low-potential terminal is clamped and a second biasing unit, connected with the second switch control unit and between the high-potential terminal and the low-potential terminal and configured to clamp the voltage of the low-potential terminal in the condition that the voltage of the high-potential terminal is clamped.

The first biasing unit can include a third MOSFET and can further be configured to control the highest voltage value of the high-potential terminal by adjusting the gate voltage of the third MOSFET and the second biasing unit can include a fourth MOSFET and can further be configured to control the lowest voltage value of the low-potential terminal by adjusting the gate voltage of the fourth MOSFET.

The high-potential terminal can be connected with the first switch control unit through a first current mirror unit and the low-potential terminal can be connected with the second switch control unit through a second current mirror unit, wherein the first current mirror unit is a current mirror circuit matched with the first switch control unit and the second current mirror unit is a current mirror circuit matched with the second switch control unit.

The comparator can include one of the following: a P-channel MOSFET differential pair comparator circuit, an N-channel MOSFET differential pair comparator circuit, and a rail-to-rail input pair comparator circuit.

A method for clamping voltage can include configuring a first switch control unit connected with a high-potential terminal of a first stage output of a comparator, wherein the first switch control unit is configured to clamp the voltage of the high-potential terminal to $V_{Gate1}$ when the voltage of the high-potential terminal is lower than a first pre-set value $V_1$, and configuring a second switch control unit connected with a low-potential terminal of the first stage output of the comparator, wherein the second switch control unit is configured to clamp the voltage of the low-potential terminal at $V_{Gate2}$ when the voltage of the low-potential terminal is higher than a second pre-set value $V_2$, wherein the voltage of the first stage output of the comparator is between $V_{GND}$ and $V_{CC}$.

The method can include using a first MOSFET as the first switch control unit, wherein the first MOSFET is turned off when the voltage of the high-potential terminal is higher than or equal to $V_1$ and is turned on when the voltage of the high-potential terminal is lower than $V_1$, so as to clamp the voltage of the high-potential terminal, and using a second MOSFET as the second switch control unit, wherein the second MOSFET is turned off when the voltage of the low-potential terminal is lower than or equal to $V_2$ and is turned on when the voltage of the low-potential terminal is higher than $V_2$, so as to clamp the voltage of the low-potential terminal.

The method can include configuring a first biasing unit connected with the first switch control unit, wherein the first biasing unit is connected between the high-potential terminal and the low-potential terminal and is configured to clamp the voltage of the high-potential terminal in the condition that the voltage of the low-potential terminal is clamped, and configuring a second biasing unit connected with the second switch control unit, wherein the second biasing unit is connected between the high-potential terminal and the low-potential terminal and is configured to clamp the voltage of the low-potential terminal in the condition that the voltage of the high-potential terminal is clamped.

The method can include using a third MOSFET as the first biasing unit, controlling the highest voltage value of the high-potential terminal by adjusting the gate voltage of the third MOSFET, using a fourth MOSFET to act as the second biasing unit, and controlling the lowest voltage value of the low-potential terminal by adjusting the gate voltage of the fourth MOSFET.

Using the circuits or methods disclosed herein, by clamping the node voltage of the first stage output of the comparator, the output voltage swings of the first stage of the comparator are limited, thus the problem of low voltage conversion rate caused by long delay of the comparator in the conventional art is solved, and thereby the processing speed of the comparator is improved.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 shows a structure diagram of an example clamp circuit.

FIG. 6 shows a flowchart of an example method for clamping.

DETAILED DESCRIPTION

Figure 1:
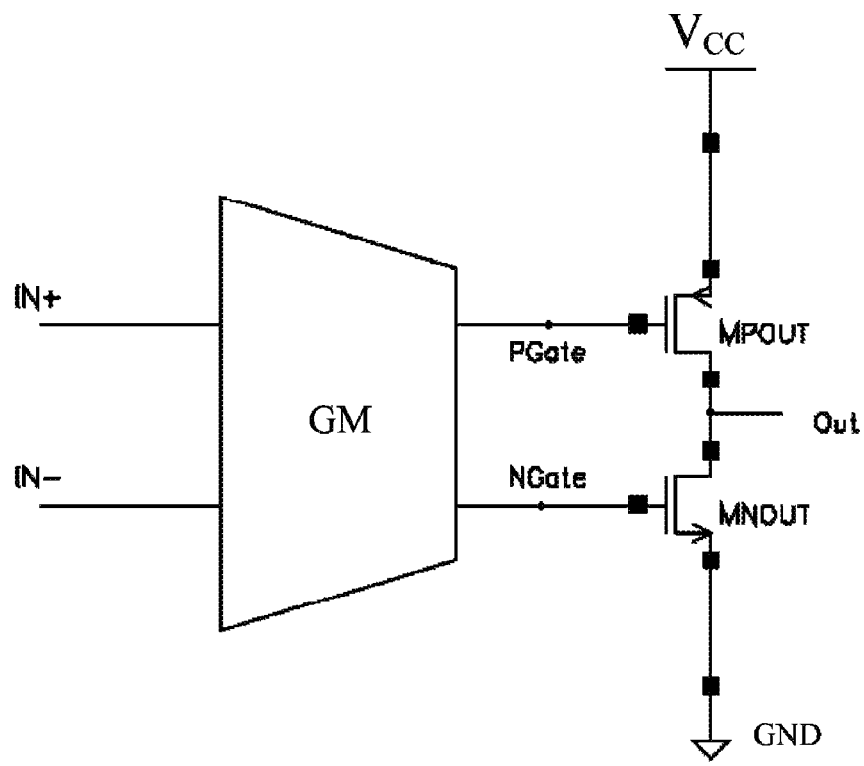
FIG. 1 shows an internal circuit schematic diagram of an existing comparator.
Figure 2:
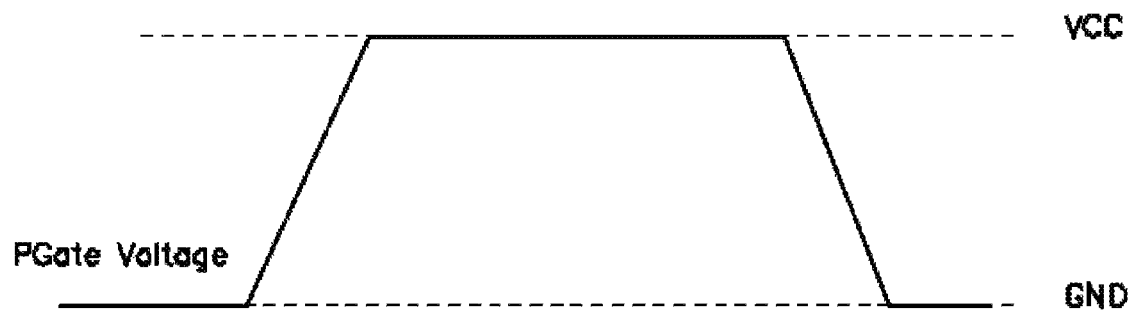
FIG. 2 shows a schematic diagram of an output voltage waveform for a node $P_{Gate}$ of a first stage output of an existing comparator.
Figure 3:
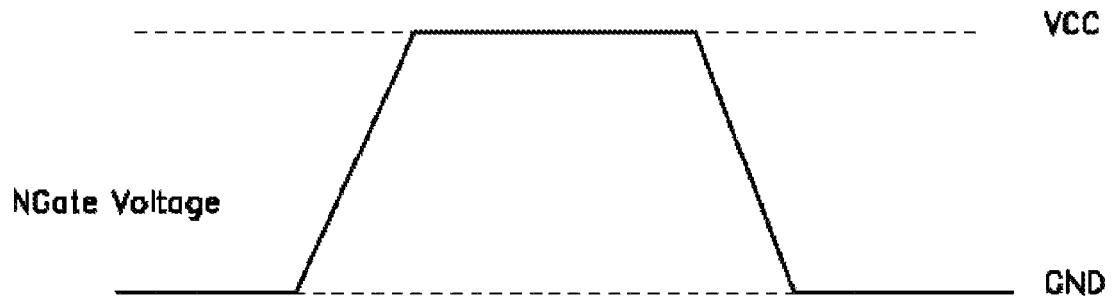
FIG. 3 shows a schematic diagram of the output voltage waveform for a node $N_{Gate}$ of a first stage output of an existing comparator.
Figure 4:
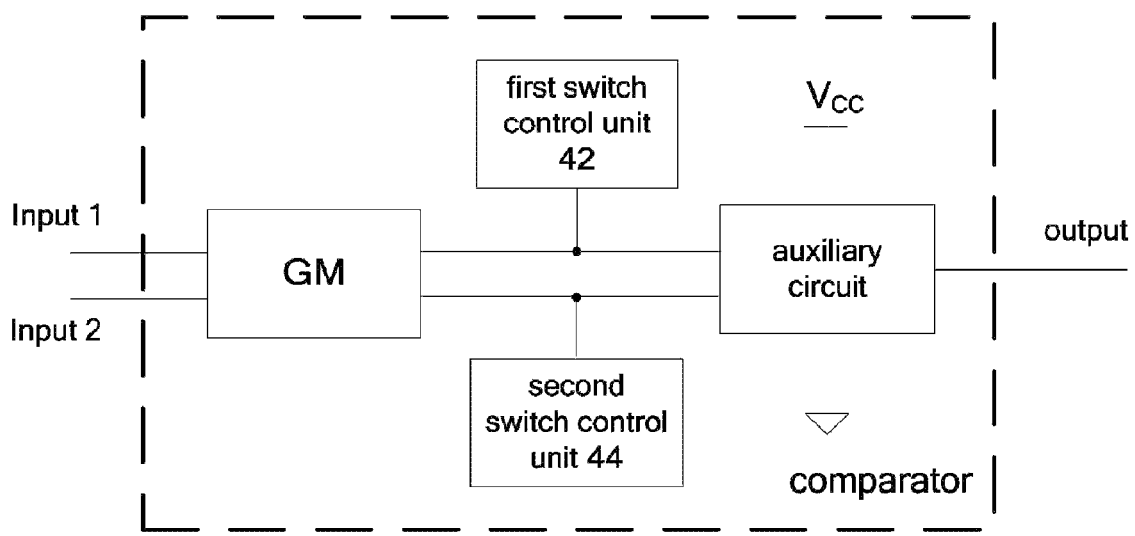
FIG. 4 shows a structure diagram of an example clamp circuit.

FIG. 4 shows a structure diagram of an example clamp circuit including a first switch control unit 42 connected with the high-potential terminal of the first stage output of a comparator and configured to clamp the voltage of the high-potential terminal to $V_{Gate1}$ when the voltage of the high-potential terminal is lower than a first pre-set value $V_1$, and a second switch control unit 44 connected to the low-potential terminal of the first stage output of the comparator and configured to clamp the voltage of the low-potential terminal to $V_{Gate2}$ when the voltage of the low-potential terminal is higher than a second pre-set value $V_2$, wherein the voltage of the first stage output of the comparator is between $V_{GND}$ and $V_{CC}$.

By the clamp circuit above, adopting the first switch control unit 42 to clamp the high-potential terminal voltage of the first stage output of the comparator and the second switch control unit 44 to clamp the low-potential terminal voltage of the first stage output of the comparator, the output voltage swings of the first stage of the comparator can be limited, thus the problem of low voltage conversion rate caused by long delay of the comparator in the conventional art can be solved, and thereby the processing speed of the comparator can be improved.

It should be noted that, during implementation, the relationship between the real-time voltage of the high-potential terminal (e.g., node $P_{Gate}$) and that of the low-potential terminal (e.g., Node $N_{Gate}$) is $V_{PGate} > V_{NGate}$. Since the first pre-set value $V_1$ and the lowest clamped voltage $V_{Gate1}$ of the node $P_{Gate}$ can be decreased along with the descent of the selected value of the power voltage $V_{CC}$, the values of the $V_1$ and the $V_{Gate1}$ probably might be less than $V_{Gate2}$. Moreover, generally, $V_1 \geq V_{Gate1}$ and $V_{Gate2} \geq V_2$ cannot be satisfied simultaneously. Because the voltage of the high-potential terminal of the first stage output of the comparator is clamped when $V_1 \geq V_{Gate1}$ is satisfied, and at this time, the voltage of the low-potential terminal of the first stage output of the comparator is not probably higher than $V_2$, likewise, the voltage of the low-potential terminal of the first stage output of the comparator is clamped when $V_{Gate2} \geq V_2$ is satisfied, and at this time, the voltage of the high-potential terminal of the first stage output of the comparator is not probably lower than $V_1$.

In an example, the first switch control unit 42 is a first MOSFET and the second switch control unit 44 is a second MOSFET, wherein the first MOSFET is turned off when the voltage of the high-potential terminal of the first stage output of the comparator is higher than or equal to $V_1$, and is turned on when the voltage of the high-potential terminal is lower than $V_1$, so as to clamp the voltage of the high-potential terminal, and the second MOSFET is turned off when the voltage of the low-potential terminal of the first stage output of the comparator is lower than or equal to $V_2$, and is turned on when the voltage of the low-potential terminal is higher than $V_2$, so as to clamp the voltage of the low-potential terminal. In this way, the flexibility and the precision of system can be improved.

For example, when the gate voltage of the first MOSFET is lower than the pre-set value $V_1$, the first MOSFET is turned on (namely, conducted), at this time, since there is an upper limit for the pull-down current of the high-potential terminal of the first stage output of the comparator, there is a lower limit $V_{Gate1}$ for the clamped voltage of the high-potential terminal.

FIG. 5 shows a structure diagram of an example clamp circuit including a first biasing unit 52 connected with the first switch control unit 42 and between the high-potential terminal and the low-potential terminal of the first stage output of the comparator and configured to clamp the voltage of the high-potential terminal in the condition that the voltage of the low-potential terminal is clamped, and a second biasing unit 54 connected with the second switch control unit 44 and between the high-potential terminal and the low-potential terminal of the first stage output of the comparator and configured to clamp the voltage of the low-potential terminal in the condition that the voltage of the high-potential terminal is clamped.

In an example, the first biasing unit 52 is a third MOSFET and is further configured to control the highest voltage value of the high-potential terminal of the first stage output of the comparator by adjusting the gate voltage of the third MOSFET, and the second biasing unit 54 is a fourth MOSFET and is further configured to control the lowest voltage value of the low-potential terminal of the first stage output of the comparator by adjusting the gate voltage of the fourth MOSFET. For example, two Metal Oxide Semiconductor (MOS) transistors are configured respectively as the first biasing unit 52 and the second biasing unit 54 in parallel between the high-potential terminal and the low-potential terminal of the first stage output of the comparator. In implementation, the gate voltage of the MOS transistor acting as the first biasing unit 52 can be selected according to requirements, namely, the highest clamped voltage of the high-potential terminal of the first stage output of the comparator can be limited by adjusting the gate voltage of the MOS, likewise, the gate voltage of the MOS transistor acting as the second biasing unit 54 can be also selected according to requirements, namely, the lowest clamped voltage of the low-potential terminal of the first stage output of the comparator can be limited by adjusting the gate voltage of the MOS transistor. It can be seen that the lowest clamped voltage of the high-potential terminal of the first stage output of the comparator can be controlled by the first switch control unit 42, and the highest clamped voltage of the high-potential terminal of the first stage output of the comparator can be controlled by the first biasing unit 52, likewise, the highest clamped voltage of the low-potential terminal of the first stage output of the comparator can be controlled by the second switch control unit 44, and the lowest clamped voltage of the low-potential terminal of the first stage output of the comparator can be controlled by the second biasing unit 54.

In an example, the high-potential terminal of the first stage output of the comparator is connected with the first switch control unit 42 through a first current mirror unit, and the low-potential terminal of the first stage output of the comparator is connected with the second switch control unit 44 through a second current mirror unit, wherein the first current mirror unit is a current mirror circuit matched with the first switch control unit 42, and the second current mirror unit is a current mirror circuit matched with the second switch control unit 44.

In an example, the above-mentioned comparator may be one of the following: P-channel MOSFET differential pair comparator circuit, N-channel MOSFET differential pair comparator circuit and rail-to-rail input pair comparator circuit. This method is simple and practical, with high operability.

FIG. 6 shows a flowchart of an example method for clamping. At step 602, a first switch control unit 42 connected with the high-potential terminal of the first stage output of a comparator is configured, wherein the first switch control unit 42 is configured to clamp the voltage of the high-potential terminal to $V_{Gate1}$ when the voltage of the high-potential terminal is lower than a first pre-set value $V_1$.

At step 604, a second switch control unit 44 connected with the low-potential terminal of the first stage output of the comparator is configured, wherein the second switch control unit 44 is configured to clamp the voltage of the low-potential terminal at $V_{Gate2}$ when the voltage of the low-potential terminal is higher than a second pre-set value $V_2$, and wherein the voltages of the first stage output of the comparator is $V_{GND}$ and $V_{CC}$.

By the above steps, adopting the method of clamping the node voltage of the first stage output of the comparator, the output voltage swings of the first stage of the comparator can be limited, thus the problem of low voltage conversion rate caused by long delay of the comparator in the conventional art can be solved, and thereby the processing speed of the comparator can be improved.

In an example, in step 602, a first MOSFET is used to act as the first switch control unit 42, wherein the first MOSFET is turned off when the voltage of the high-potential terminal of the first stage output of the comparator is higher than or equal to $V_1$, and is turned on when the voltage of the high-potential terminal is lower than $V_1$, so as to clamp the voltage of the high-potential terminal, in Step 604, a second MOSFET is used to act as the second switch control unit 44, wherein the second MOSFET is turned off when the voltage of the low-potential terminal is lower than or equal to $V_2$, and is turned on when the voltage of the low-potential terminal is higher than $V_2$, so as to clamp the voltage of the low-potential terminal. This method is simple and practical, with high operability.

In an example, a first biasing unit 52 connected with the first switch control unit 42 may be also configured, wherein the first biasing unit 52 is connected between the high-potential terminal and the low-potential terminal of the first stage output of the comparator and is configured to clamp the voltage of the high-potential terminal in the condition that the voltage of the low-potential terminal is clamped, and a second biasing unit 54 connected with the second switch control unit 44 may be also configured, wherein the second biasing unit 54 is connected between the high-potential terminal and the low-potential terminal of the first stage output of the comparator and is configured to clamp the voltage of the low-potential terminal in the condition that the voltage of the high-potential terminal is clamped.

In implementation, a third MOSFET may be used to act as the first biasing unit 52, wherein the highest voltage value of the high-potential terminal can be controlled by adjusting the gate voltage of the third MOSFET and a fourth MOSFET may be used to act as the second biasing unit 54, wherein the lowest voltage value of the low-potential terminal can be controlled by adjusting the gate voltage of the fourth MOSFET.

Figure 7:
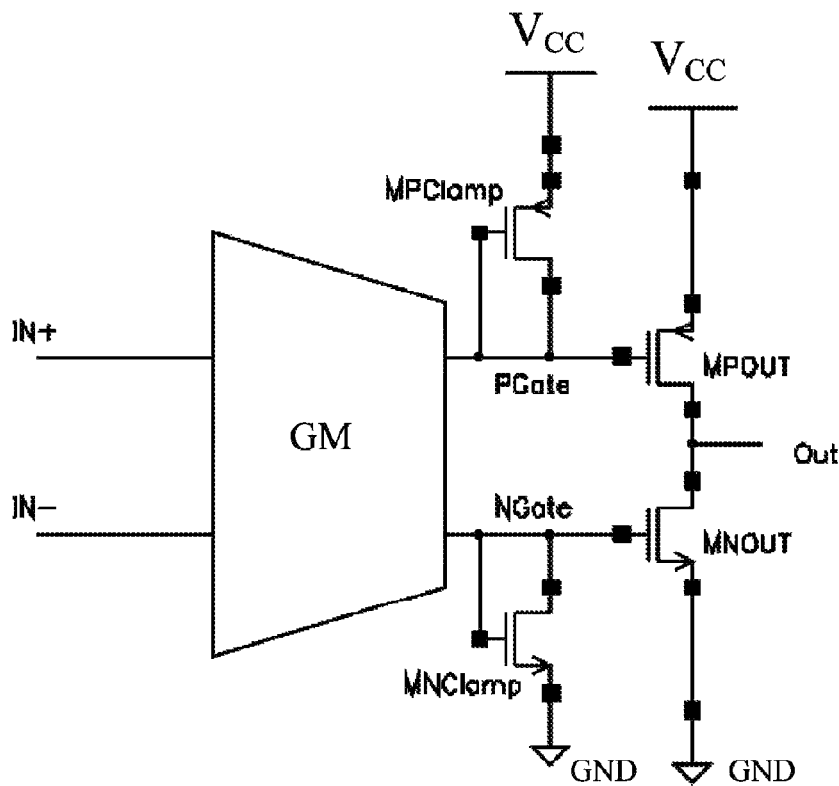
FIG. 7 shows an internal circuit schematic diagram of an example comparator.

FIG. 7 shows an internal circuit schematic diagram of an example comparator. As shown in FIG. 7, a clamping MOS transistor MPClamp (namely, the first switch control unit 42) is connected at the node $P_{Gate}$ (the high-potential node of the first stage output of the comparator) and is configured to clamp the lowest voltage of the node $P_{Gate}$, and a clamping MOS transistor MNClamp (namely, the second switch control unit 44) is connected at the node $N_{Gate}$ (the low-potential node of the first stage output of the comparator) and is configured to clamp the highest voltage of the node $N_{Gate}$, thereby limiting the voltage swings of the first stage output node of the comparator, so that the delay time of the comparator is reduced and the voltage conversion rate is improved.

Figure 8:
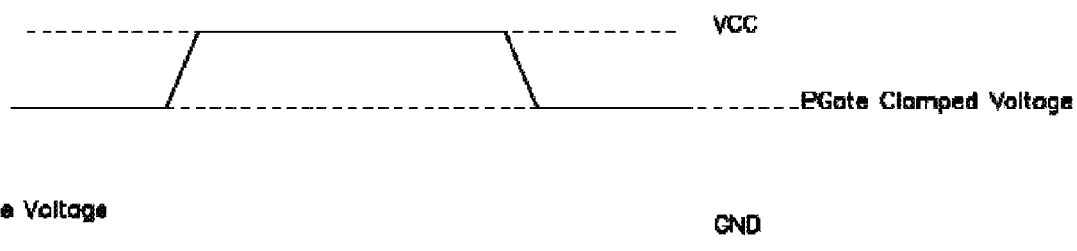
FIG. 8 shows a schematic diagram of an example output voltage waveform for a node $P_{Gate}$ of the first stage output of a comparator.

FIG. 8 shows a schematic diagram of an example output voltage waveform for a node $P_{Gate}$ of the first stage output of a comparator. As shown in FIG. 8, the voltage of the node $P_{Gate}$ is clamped to between $V_{PGate\_clamped}$ (namely, $V_{Gate1}$) and $V_{CC}$.

Figure 9:
FIG. 9 shows a schematic diagram of an example output voltage waveform for the node $N_{Gate}$ of the first stage output of a comparator.

FIG. 9 shows a schematic diagram of an example output voltage waveform for the node $N_{Gate}$ of the first stage output of a comparator. As shown in FIG. 9, the voltage of the node $N_{Gate}$ is clamped to between $V_{GND}$ and $V_{NGate\_clamped}$ (namely, $V_{Gate2}$).

It can be seen that in this example the voltage swings of both the node $P_{Gate}$ and the node $N_{Gate}$ does not reach full swing ($V_{GND}$ to $V_{CC}$), so that the delay time of the first stage output of the comparator becomes shorter, that is, the delay time of the comparator is reduced by limiting the output voltage swings of the first stage output, so as to improve the voltage conversion rate of the comparator.

In this example, the voltage swings of the node which has a limited voltage conversion rate are limited by using a clamping MOSFET, so as to speed up a comparator. A method for clamping the first stage output voltage of a comparator is provided, wherein both node and cascade node of the first stage output of the comparator are clamped, in order to limit the voltage swings of the first stage output of the clamping comparator.

Figure 10:
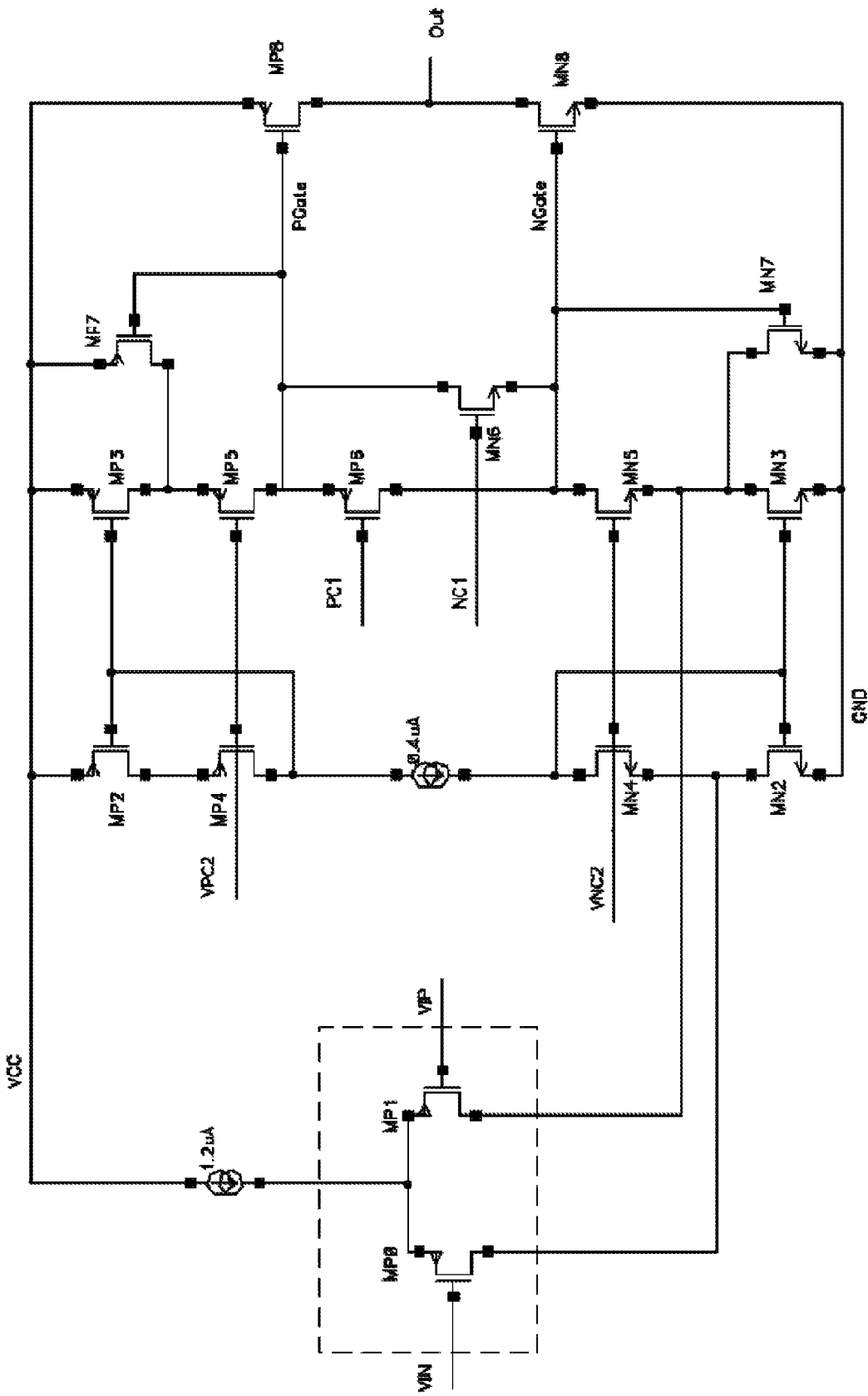
FIG. 10 shows an internal circuit schematic diagram of an example comparator.

FIG. 10 shows an internal circuit schematic diagram of an example comparator. As shown in FIG. 10, a PMOS transistor (MP7) and an NMOS (MN7) (namely, switch control units) which are used for clamping are added to limit the voltage swings of the first stage output of the comparator, so as to reduce the delay time of the comparator.

In this example, the two middle MOS transistors (MP6 and MN6) act as feed-forward class-AB, namely, two MOS transistors (MP6 and MN6) are configured between the high-potential terminal (node $P_{Gate}$) and the low-potential terminal (node $N_{Gate}$) of the first stage (GM circuit, namely, MP0, MP1) output inside the comparator, so as to limit the highest voltage of the high-potential terminal and the lowest voltage of the low-potential terminal.

Specifically, the MP6 (namely, the first biasing unit 52) and the MN6 (namely, the second biasing unit 54) belong to class-AB bias circuit and PC1 and NC1 are gate voltage for controlling the class-AB bias circuit, wherein the MP6 and MN6 have the following functions of: (1) making the bias output stage in class-AB state; (2) separating the nodes $P_{Gate}$ and $N_{Gate}$, so that the nodes $P_{Gate}$ and $N_{Gate}$ can have different clamped voltages; (3) configuring clamped voltages, namely, configuring the clamped voltage values of the nodes $P_{Gate}$ and $N_{Gate}$ by selecting different values for MP6 and MN6. For example, in FIG. 10, the highest voltage value of the node $P_{Gate}$ can be controlled by adjusting the gate (PC1) of the MP6, and the lowest voltage value of the node $N_{Gate}$ can be controlled by adjusting the gate (NC1) of the MN6.

In an example, a current mirror current may be also configured between the first stage output of the comparator and the above-mentioned clamp circuit. As shown in FIG. 10, a current mirror circuit which consists of MP2, MP3, MP4 and MP5 is configured at the node $P_{Gate}$, and a current mirror circuit which consists of MN2, MN3, MN4 and MN5 is set at the node $N_{Gate}$, wherein VPC2 and VNC2 are gate voltage. It should be noted that the MP4 and MP5 are components which is configured to improve the matching of the current mirror in the cascade stage, so are similar to the MN4 and MN5. In a practical application, these four components can be optional.

In an example, MP7 is a clamping PMOS transistor. When the voltage of the node $P_{Gate}$ is too low, the MP7 is conducted so as to clamp the node $P_{Gate}$. For example, when the output MP7 gate voltage is lower than a certain value, the MP7 is conducted, since the pull-down current of the node $P_{Gate}$ has an upper limit, the clamped voltage of the node $P_{Gate}$ has a lower limit. As shown in FIG. 10, the drain of the MP7 is connected to the source of the MP5, wherein this connection can clamp the source voltage of the MP5. MN7 is a clamping NMOS transistor. When the voltage of the node $N_{Gate}$ is too high, the MN7 is conducted so as to clamp the node $N_{Gate}$. As shown in FIG. 10, the drain of the MN7 is connected to the source of the MN5, wherein this connection can clamp the source voltage of the MN5.

In an example, when the current 1.2 uA flows through MP0, the current of MN2 is equal to "0.4 uA+1.2 uA", MN3, as current mirror, has the current of 1.6 uA too, at this time, the current of MP1 is 0, thus the current of MN5 is 1.6 uA, which lowers the potential of the node $N_{Gate}$ and thereby conducts the MN6 (1.6 uA). Since MP2 and MP3 are current mirrors, the current of MN6 (namely, 1.6 uA pull-down current)=the current of MP7+the current of MP3, thus the current of MP7 is 1.2 uA, the node $P_{Gate}$ is clamped by MP7, and the voltage of the node $N_{Gate}$ is clamped to "NC1−VGS(MN6)" by the MN6, namely, the voltage of NC1 minus the voltage threshold of MN6.

In an example, when the current 1.2 uA flows through MP1, the currents of both MN2 and MN3 are 0.4 uA, since MP3 and MP2 are current mirrors, the current of MP3 is 0.4 uA, MP5 and MP6 conduct with 0.4 uA current to pull up the potential of the nodes $P_{Gate}$ and $N_{Gate}$, at this moment, the current of MN7 is: the current of MP1−the current of MN3+the current of MP6=1.2−0.4+0.4=1.2 uA. Therefore, the potential (namely, voltage) of the node $N_{Gate}$ is clamped to VGS (voltage threshold) of MN7, while the voltage of the node $P_{Gate}$ is clamped to "PC1−VGS(MP6)", namely, the voltage of PC1 minus the voltage threshold of MP6.

Figure 11:
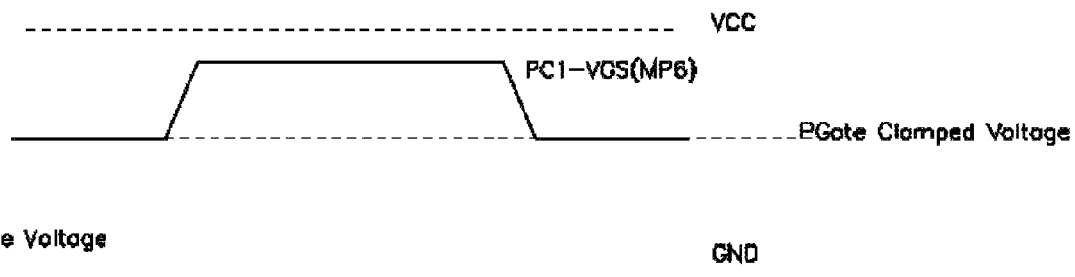
FIG. 11 shows a schematic diagram of an example output voltage waveform for a node $P_{Gate}$ of a first stage output of a comparator.

FIG. 11 shows a schematic diagram of an example output voltage waveform for a node $P_{Gate}$ of a first stage output of a comparator. As shown in FIG. 11, the biggest swing of the voltage of the node $P_{Gate}$ is from the Clamped voltage (namely, $V_{Gate1}$) of the node $P_{Gate}$ to "PC1−VGS(MP6)", which does not reach $V_{CC}$.

Figure 12:
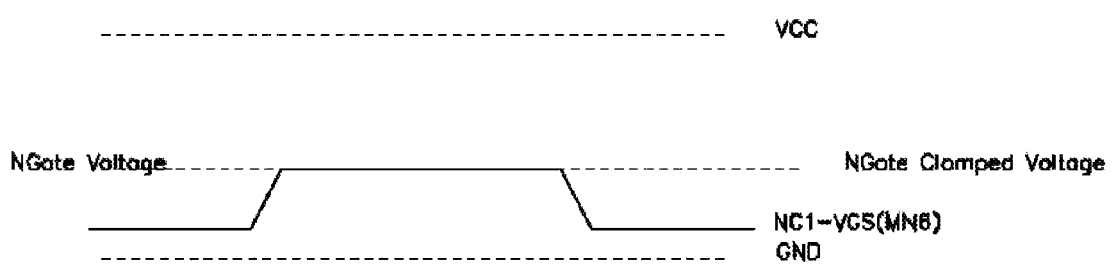
FIG. 12 shows a schematic diagram of an example output voltage waveform for a node $N_{Gate}$ of a first stage output of a comparator.

FIG. 12 shows a schematic diagram of an example output voltage waveform for a node $N_{Gate}$ of a first stage output of a comparator. As shown in FIG. 12, the biggest swing of the voltage of the node $N_{Gate}$ is from the Clamped voltage (namely, $V_{Gate2}$) of the node $N_{Gate}$ to "NC1−VGS(MN6)", which does not reach GND. That is to say, by the method provided in this example, the swing amplitude of the voltages of the first stage output inside the comparator is limited, thus the delay of the comparator is reduced and the speed of the comparator is improved.

Hereinafter, the clamped voltage of the nodes $P_{Gate}$ and $N_{Gate}$ is concluded in conjunction with FIG. 10, FIG. 11 and FIG. 12.

(1) For the node $P_{Gate}$: the MP7 is turned on, then the voltage of the node $P_{Gate}$ $V_{PGate} \geq $VP1 (namely, $V_{Gate1}$), the maximum turnon voltage of the MP6 is $V_{PGate}$, and $V_{PGate} \leq $VP2 (namely, the "PC1−VGS(MP6)" shown in FIG. 11), by adjusting PC1, VP2 can be adjusted, but VP1 can not.

(2) For the node $N_{Gate}$: the MN7 is turned on, then the voltage of the node $N_{Gate}$ $V_{NGate} \leq $VN1 (namely, $V_{Gate2}$), the maximum turnon voltage of the MN6 is $V_{NGate}$, and $V_{NGate} \leq VN2$ (namely, the "NC1–VGS(MN6)" shown in FIG. 12), VN2 can be adjusted by adjusting NC1.

In addition, during implementation, if the drains of the MP7 and the MN7 are connected to their gates respectively, namely, the drain of the MP7 is connected to the gate of the MP7, and the drain of the MN7 is connected to the gate of the MN7. Although part clamping functions are reserved, the clamping for the source voltage of the MP5 and the MN5 is failed at this moment.

It should be noted that the input stage circuit which may act as the MOS transistor clamp circuit provided by the examples herein can be of: PMOS transistor differential pair, NMOS transistor differential pair and rail-to-rail input pair, and so on.

In this example, the output voltage swings of the first stage of the comparator are limited by using a clamping MOS transistor, wherein both outputs of the first stage have respective clamp circuit, and the clamp circuit is configured to clamp the output node and the cascade node of the first stage. That is, the voltage swing of the node is limited by the MOS transistor clamp circuit, so that the delay time is reduced by about one seventh.

Adopting the method of clamping the node voltage of the first stage output of the comparator, the output voltage swings of the first stage of the comparator can be limited, thus the problem of low voltage conversion rate caused by long delay of the comparator in the conventional art is solved, and thereby the processing speed of the comparator is improved.

Obviously, those skilled in the art shall understand that the above-mentioned modules and steps of the disclosure can be realized by using general purpose calculating device, can be integrated in one calculating device or distributed on a network which consists of a plurality of calculating devices. Alternatively, the modules and the steps of the disclosure can be realized by using the executable program code of the calculating device. Consequently, they can be stored in the storing device and executed by the calculating device, moreover, in some situation, they can be executed the showed or described steps in an order different from this illustrated therein, or they are made into integrated circuit module respectively, or a plurality of modules or steps thereof are made into one integrated circuit module. In this way, the disclosure is not restricted to any particular hardware and software combination.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A clamp circuit, comprising:
   a first switch control unit, connected with a high-potential terminal of a first stage output of a comparator and configured to clamp the voltage of the high-potential terminal to $V_{Gate1}$ when the voltage of the high-potential terminal is lower than a first pre-set value $V_1$; and
   a second switch control unit, connected to a low-potential terminal of the first stage output of the comparator and configured to clamp the voltage of the low-potential terminal to $V_{Gate2}$ when the voltage of the low-potential terminal is higher than a second pre-set value $V_2$;
   wherein the voltage of the first stage output of the comparator is between $V_{GND}$ and $V_{CC}$; and
   wherein the high-potential terminal is connected with the first switch control unit through a first current mirror unit, and the low-potential terminal is connected with the second switch control unit through a second current mirror unit.

2. The circuit according to claim 1, wherein the first switch control unit is a first Metal Oxide Semiconductor Field Effect Transistor (MOSFET) and the second switch control unit is a second MOSFET, wherein:
   the first MOSFET is turned off when the voltage of the high-potential terminal is higher than or equal to $V_1$, and is turned on when the voltage of the high-potential terminal is lower than $V_1$, so as to clamp the voltage of the high-potential terminal; and
   the second MOSFET is turned off when the voltage of the low-potential terminal is lower than or equal to $V_2$, and is turned on when the voltage of the low-potential terminal is higher than $V_2$, so as to clamp the voltage of the low-potential terminal.

3. The circuit according to claim 2, wherein the comparator is one of the following: a P-channel MOSFET differential pair comparator circuit; an N-channel MOSFET differential pair comparator circuit; or a rail-to-rail input pair comparator circuit.

4. The circuit according to claim 1, further comprising:
a first biasing unit, connected with the first switch control unit and between the high-potential terminal and the low-potential terminal and configured to clamp the voltage of the high-potential terminal in the condition that the voltage of the low-potential terminal is clamped; and
a second biasing unit, connected with the second switch control unit and between the high-potential terminal and the low-potential terminal and configured to clamp the voltage of the low-potential terminal in the condition that the voltage of the high-potential terminal is clamped.

5. The circuit according to claim 4, wherein the first biasing unit is a third MOSFET and is further configured to control the highest voltage value of the high-potential terminal by adjusting a gate voltage of the third MOSFET; and the second biasing unit is a fourth MOSFET and is further configured to control the lowest voltage value of the low-potential terminal by adjusting a gate voltage of the fourth MOSFET.

6. The circuit according to claim 5, wherein the comparator is one of the following: a P-channel MOSFET differential pair comparator circuit; an N-channel MOSFET differential pair comparator circuit; or a rail-to-rail input pair comparator circuit.

7. The circuit according to claim 4, wherein the comparator is one of the following: a P-channel MOSFET differential pair comparator circuit; an N-channel MOSFET differential pair comparator circuit; or a rail-to-rail input pair comparator circuit.

8. The circuit according to claim 1, wherein the comparator is one of the following: a P-channel MOSFET differential pair comparator circuit; an N-channel MOSFET differential pair comparator circuit; or a rail-to-rail input pair comparator circuit.

9. The circuit according to claim 1, wherein the first current mirror unit is a current mirror circuit matched with the first switch control unit, and the second current mirror unit is a current mirror circuit matched with the second switch control unit.

10. A method for clamping voltage, comprising:
configuring a first switch control unit connected with a high-potential terminal of a first stage output of a comparator, wherein the first switch control unit is configured to clamp the voltage of the high-potential terminal to $V_{Gate1}$ when the voltage of the high-potential terminal is lower than a first pre-set value $V_1$; and
configuring a second switch control unit connected with a low-potential terminal of the first stage output of the comparator, wherein the second switch control unit is configured to clamp the voltage of the low-potential terminal to $V_{Gate2}$ when the voltage of the low-potential terminal is higher than a second pre-set value $V_2$;
wherein the voltage of the first stage output of the comparator is between $V_{GND}$ and VCC; and
wherein the high-potential terminal is connected with the first switch control unit through a first current mirror unit, and the low-potential terminal is connected with the second switch control unit through a second current mirror unit.

11. The method according to claim 10, further comprising:
using a first MOSFET as the first switch control unit, wherein the first MOSFET is turned off when the voltage of the high-potential terminal is higher than or equal to $V_1$, and is turned on when the voltage of the high-potential terminal is lower than $V_1$, so as to clamp the voltage of the high-potential terminal; and
using a second MOSFET as the second switch control unit, wherein the second MOSFET is turned off when the voltage of the low-potential terminal is lower than or equal to $V_2$, and is turned on when the voltage of the low-potential terminal is higher than $V_2$, so as to clamp the voltage of the low-potential terminal.

12. The method according to claim 11, further comprising:
configuring a first biasing unit connected with the first switch control unit, wherein the first biasing unit is connected between the high-potential terminal and the low-potential terminal and is configured to clamp the voltage of the high-potential terminal in the condition that the voltage of the low-potential terminal is clamped; and
configuring a second biasing unit connected with the second switch control unit, wherein the second biasing unit is connected between the high-potential terminal and the low-potential terminal and is configured to clamp the voltage of the low-potential terminal in the condition that the voltage of the high-potential terminal is clamped.

13. The method according to claim 10, further comprising:
configuring a first biasing unit connected with the first switch control unit, wherein the first biasing unit is connected between the high-potential terminal and the low-potential terminal and is configured to clamp the voltage of the high-potential terminal in the condition that the voltage of the low-potential terminal is clamped; and
configuring a second biasing unit connected with the second switch control unit, wherein the second biasing unit is connected between the high-potential terminal and the low-potential terminal and is configured to clamp the voltage of the low-potential terminal in the condition that the voltage of the high-potential terminal is clamped.

14. The method according to claim 13, further comprising:
using a third MOSFET as the first biasing unit, and controlling the highest voltage value of the high-potential terminal by adjusting a gate voltage of the third MOSFET; and
using a fourth MOSFET as the second biasing unit, and controlling the lowest voltage value of the low-potential terminal by adjusting a gate voltage of the fourth MOSFET.

15. The method according to claim 10, wherein the first current mirror unit is a current mirror circuit matched with the first switch control unit, and the second current mirror unit is a current mirror circuit matched with the second switch control unit.

16. A clamp circuit, comprising:
a comparator having a first stage output including a high-potential terminal and a low-potential terminal;
a first switch control unit, connected with the high-potential terminal of the first stage output of the comparator and configured to clamp the voltage of the high-potential terminal to $V_{Gate1}$ when the voltage of the high-potential terminal is lower than a first pre-set value $V_1$; and
a second switch control unit, connected to the low-potential terminal of the first stage output of the comparator and configured to clamp the voltage of the low-potential terminal to $V_{Gate2}$ when the voltage of the low-potential terminal is higher than a second pre-set value $V_2$;
wherein the voltage of the first stage output of the comparator is between $V_{GND}$ and $V_{CC}$; and
wherein the high-potential terminal is connected with the first switch control unit through a first current mirror unit, and the low-potential terminal is connected with the second switch control unit through a second current mirror unit.

17. The circuit according to claim 16, wherein the first current mirror unit is a current mirror circuit matched with the first switch control unit, and the second current mirror unit is a current mirror circuit matched with the second switch control unit.

18. The circuit according to claim 17, wherein the comparator is one of the following: a P-channel MOSFET differential pair comparator circuit, an N-channel MOSFET differential pair comparator circuit, or a rail-to-rail input pair comparator circuit.

19. The circuit according to claim 16, further comprising:
   a first biasing unit, connected with the first switch control unit and between the high-potential terminal and the low-potential terminal and configured to clamp the voltage of the high-potential terminal in the condition that the voltage of the low-potential terminal is clamped; and
   a second biasing unit, connected with the second switch control unit and between the high-potential terminal and the low-potential terminal and configured to clamp the voltage of the low-potential terminal in the condition that the voltage of the high-potential terminal is clamped.

* * * * *